US006214259B1

(12) United States Patent
Oda et al.

(10) Patent No.: US 6,214,259 B1
(45) Date of Patent: Apr. 10, 2001

(54) DISPERSION CONTAINING CU ULTRAFINE PARTICLES INDIVIDUALLY DISPERSED THEREIN

(75) Inventors: Masaaki Oda, Chiba-ken; Nobuya Imazeki, Ibaraki-ken; Hiroyuki Yamakawa, Ibaraki-ken; Hirohiko Murakami, Ibaraki-ken, all of (JP)

(73) Assignees: Vacuum Metallurgical Co., Ltd., Chiba-ken (JP); Nihon Shinku Gijutsu Kabushiki Kaisha, Kanagawa-ken (JP)

( * ) Notice: Subject to any disclaimer, the term of this patent is extended or adjusted under 35 U.S.C. 154(b) by 0 days.

(21) Appl. No.: 09/369,932

(22) Filed: Aug. 9, 1999

(30) Foreign Application Priority Data

Aug. 10, 1998 (JP) .................................. 10-226141

(51) Int. Cl.$^7$ ........................................ H01B 1/00
(52) U.S. Cl. .................... 252/500; 252/512; 252/513; 156/247; 174/256; 174/257; 427/123; 427/96
(58) Field of Search ..................... 156/247, 253, 156/272.8; 427/123, 125, 96, 97; 174/257, 262, 263; 252/500, 513, 512, 514

(56) References Cited

U.S. PATENT DOCUMENTS

| 5,587,111 | 12/1996 | Watanabe et al. . | |
|---|---|---|---|
| 5,746,868 | * 5/1998 | Abe | 156/247 |
| 5,750,194 | 5/1998 | Watanabe et al. . | |
| 5,953,629 | * 9/1999 | Imazeki et al. | 438/679 |

FOREIGN PATENT DOCUMENTS

| 4-210481 | 7/1992 | (JP) . |
| 9-134891 | 5/1997 | (JP) . |

OTHER PUBLICATIONS

T. Sawaguchi, et al., "Effect of Microstructure of Bismuth Metal Particle Filled Ceramic Composite on the PTCR Property," Proceedings of the Annual Meeting, 1998, The Ceramic Society of Japan, Mar. 3, 1998, p. 319.

T. Sawaguchi, et al., "Effect of Resistivity of the Matrix Ceramics in Bismuth Metal Particle Filled Ceramic Composite on the PTCR Property," Proceedings of the Fall Meeting, 1997, The Ceramic Society of Japan, Oct. 2, 1997, vol. 10, p. 197.

T. Sawaguchi, et al., "The PTCR Property of the Bismuth Metal Particle Filled Ceramic Composite Sintered by Hot Pressing," Proceedings of the Fall Meeting, 1998, The Ceramic Society of Japan, Oct. 1, 1998, vol. 11, p. 106.

* cited by examiner

*Primary Examiner*—Yogendra Gupta
*Assistant Examiner*—Derrick G. Hamlin
(74) *Attorney, Agent, or Firm*—Arent Fox Kintner Plotkin & Kahn PLLC

(57) ABSTRACT

A dispersion containing Cu ultrafine particles individually dispersed therein comprises an organic solvent which is hardly evaporated at room temperature, but can be evaporated during a drying-firing step upon forming Cu-distributing wires on a semiconductor substrate and metal Cu-containing ultrafine particles having a particle size of not greater than 0.01 $\mu$m, in which the surface of the individual Cu ultrafine particles is surrounded by or covered with the organic solvent, these particles are independently dispersed in the solvent, and the dispersion has a viscosity of not higher than 50 cP at 20° C. The individual Cu ultrafine particle dispersion permits the complete embedding or filling of, for instance, fine wiring grooves, via holes and contact holes of LSI substrates with a Cu-thin film and thus permits the formation of a conductive, uniform and fine pattern on a substrate.

19 Claims, No Drawings

DISPERSION CONTAINING CU ULTRAFINE PARTICLES INDIVIDUALLY DISPERSED THEREIN

BACKGROUND OF THE INVENTION

1. Field of the Invention

The present invention relates to a dispersion containing Cu ultrafine particles individually dispersed therein and more particularly to a dispersion containing individually dispersed Cu ultrafine particles, which can be used for forming fine distributing wires of semiconductor substrates such as LSI substrates and for embedding or filling up recessed portions, such as via holes and contact holes, formed on the substrates.

2. Prior Art

As metal pastes for forming a conductive, uniform and fine pattern used when forming multilayer distributing wires on semiconductor substrates such as LSI substrates, there have conventionally been known those comprising an organic solvent containing alcohols or organic esters which have not less than 5 carbon atoms and ultrafine metal particles having a particle size of not more than 1000 Å (0.1 μm) uniformly dispersed therein while the surface of the ultrafine particles are individually surrounded by or covered with the organic solvent (see, for instance, Gazetted Japanese Patent No. 2,561,537).

However, these metal pastes according to the conventional techniques suffer from the following drawbacks. As the width of the distributing wires formed on an LSI substrate has increasingly been finer from 0.25 μm to 0.18 μm or even more finer, the metal paste applied onto the substrate begins to be dried prior to sufficient embedding or filling up of grooves for distributing wires or it is difficult to completely embed or fill up fine grooves with the metal paste because the paste has a too high viscosity.

SUMMARY OF THE INVENTION

The present invention has been developed in order to solve these problems associated with the conventional techniques and accordingly, it is an object of the present invention to provide a dispersion containing Cu ultrafine particles individually dispersed therein, which can completely embed or fill up recessed portions, such as fine grooves for distributing wires, via holes and contact holes, formed on semiconductor substrates such as LSI substrates and which permits the formation of a conductive, uniform and fine pattern on the substrate.

According to the present invention, the foregoing object can effectively be accomplished by providing a dispersion containing Cu ultrafine particles individually dispersed therein (hereinafter simply referred to as "individual Cu ultrafine particle dispersion"), which has a viscosity of not higher than 50 cP (as determined at 20° C.), and which can be prepared by mixing an organic solvent that is hardly evaporated at room temperature, but can be evaporated during the drying-firing step upon forming Cu-distributing wires on a semiconductor substrate with metal Cu-containing ultrafine particles having a particle size of not greater than 0.01 μm, wherein the surface of the Cu individual ultrafine particles are surrounded by or covered with the organic solvent and thus these particles are independently dispersed in the solvent. The organic solvent is preferably those which can be evaporated at a temperature of not less than 150° C. Examples of the organic solvents preferably used herein are mineral spirits, tridecane, dodecylbenzene or mixture thereof or these solvents to which α-terpineol is added. Moreover, these solvents may, if necessary, be mixed with a hydrocarbon such as Pinene or the like, an alcohol such as n-Heptanol or the like, an ether such as Ethyl benzyl ether or the like, an ester such as n-Butyl stearate or the like, a ketone such as Diisobutyl ketone or the like, an organic nitrogen atom-containing compound such as Triisopropanol amine or the like, or an organic silicon atom-containing compound such as Silicon oil or the like, which have not less than 5 carbon atoms, or a mixture thereof, depending on the purpose of the Cu—containing dispersion to be used. Examples of the foregoing metal Cu— containing ultrafine particles desirably used herein can be those comprising elemental Cu particles, CuO particles or mixed Cu and CuO particles. In addition, the concentration of the metal Cu-containing ultrafine particles in the dispersion in general ranges from 5 to 70% by weight and preferably 15 to 50% by weight on the basis of the total weight of the dispersion. If the concentration exceeds 70%, the viscosity becomes too high and if the concentration is below 15%, the film thickness is too small. The viscosity of the individual Cu ultrafine particle dispersion is not more than 50 cP and preferably not more than 10 cP at 20° C. This is because if the viscosity exceeds 50 cP, the resulting dispersion does not show the desired characteristic properties such as recessed portion (such as grooves for distributing wires, via holes and contact holes)-filling up properties. The metal Cu-containing ultrafine particles may comprise, in addition to elemental Cu, at least one metal or metal-containing compound whose solubility in Cu is low and which is susceptible to the reaction with the basic material for a semiconductor substrate and thus the adhesion thereof to the basic material may be substantially improved. Specific examples of such metals or metal-containing compounds other than elemental Cu are Mg, Al, B, Ta, Nb and V and compounds containing these metals. The compounds containing the above-mentioned includes, for instance, $(C_{17}H_{35}COO)_2Mg$ and the like. The amount of these metals or metal-containing compounds to be added to the metal Cu-containing ultrafine particles ranges from 0.5 to 5 wt % based on the total weight of the Cu ultrafine particles.

DETAILED DESCRIPTION OF THE PREFERRED EMBODIMENTS

The individual Cu ultrafine particle dispersion according to the present invention will hereinafter be described in more detail with reference to the following working Examples, but the present invention is not restricted to these specific Examples at all.

EXAMPLE 1

An individual Cu ultrafine particle dispersion containing 20% by weight of Cu ultrafine particles having an average particle size of 0.008 μm was prepared by the gas phase evaporation method, i.e., by evaporating metal Cu under such a condition as a helium pressure of 0.5 Torr, while coming the Cu ultrafine particles during the process for forming the same in contact with the vapor of mineral spirit and then cooling and recovering the resulting ultrafine particles in the form of a dispersion in which the Cu ultrafine particles were individually dispersed in the dispersion medium. The viscosity of the resulting dispersion was determined and found to be 5 cP at room temperature.

Then via holes formed on the surface of an Si substrate were treated with the individual Cu ultrafine particle dispersion thus prepared. In this regard, the Si substrate was provided with an $SiO_2$ film as an insulating film through which via holes having a diameter of 0.15 μm (aspect ratio: 5) and a diameter of 0.25 μm (aspect ratio: 4) had been formed. Moreover, a barrier film of WN having a thickness of 0.02 μm was formed on the surface of the Si substrate including the inner walls of the via holes by sputtering and a seed film of Cu was formed on the surface of the barrier film.

Then the substrate thus treated was mounted on a spin coater, followed by rotating the coater at a rate of 500 rpm and then dropwise addition of the individual Cu ultrafine particle dispersion from the top of the coater at room temperature to thus subject the substrate to spin coating. The via holes were filled with the dispersion and accordingly, an even liquid film of the dispersion was formed on the surface of the substrate. The substrate provided thereon with the liquid film was heated to a temperature of 250° C. in a vacuum of not higher than $10^{-2}$ Torr for 2 minutes to thus remove the organic solvent and then fired in a $CO_2$ gas atmosphere at a pressure of 760 Torr for 60 minutes while raising the temperature to 300° C. Moreover, the substrate was fired in an inert gas for 30 minutes while raising the temperature up to 400° C. Thus, a Cu-thin film was formed through mutual fusion of Cu ultrafine particles, which in turn embedded or filled up the via holes without forming any void and the resulting Cu-thin film was free of any shrinkage and crack. Then the Cu-thin film except for that present within the via holes was subjected to the CMP treatment to remove the excess Cu present on the surface of the substrate. Thus, a Cu-thin film having an even surface was formed within the via holes. The specific resistance of the film thus formed was determined and was found to be 2.0 μΩ·cm.

EXAMPLE 2

An individual CuO ultrafine particle dispersion which contained 25% by weight of CuO ultrafine particles having an average particle size of 0.01 μm and whose viscosity was 10 cP at 20° C. was prepared by the gas phase evaporation method, i.e., by evaporating metal Cu in a mixed gas atmosphere of helium gas of 1 Torr to which 0.01 Torr of $O_2$ gas was added to form CuO ultrafine particles, while coming the CuO ultrafine particles in contact with a mixed vapor of dodecylbenzene and diethyl phthalate and then cooling the same. Alternatively, this individual CuO ultrafine particle dispersion was blended with the individual Cu ultrafine particle dispersion prepared in Example 1 to form a mixed dispersion containing both Cu and CuO ultrafine particles and having a viscosity of 7 cP at 20° C.

Then the same procedures used in Example 1 were repeated using the foregoing dispersions to embed or fill up via holes on a substrate at room temperature and to thus form a Cu-thin film. All of the resulting thin films were completely free of any shrinkage and crack even after the sintering or firing step and the specific resistance thereof was found to be 2.0 μΩ·cm.

EXAMPLE 3

The same procedures used in Example 1 were repeated except that a mixed solvent of tridecane and phenetole was used as the organic solvent to give an individual Cu ultrafine particle dispersion having a concentration of the ultrafine particles equal to 50% by weight, as a substitute for that used in Example 1. To the resulting dispersion, there was added an organic compound of Mg, Al, B, Ta, Nb or V. All of the dispersions thus obtained were found to have a viscosity equal to 10 cP at 20° C.

Then the same procedures used in Example 1 were likewise repeated except for the processes for forming the WN barrier film and the Cu seed film, using these dispersions to thus embed or fill up the via holes of substrates and to form Cu-thin films. As a result, it was found that each resulting thin film did not cause any shrinkage and crack even after the firing or sintering step and during the leveling treatment by the CMP method and that the thin film was excellent in the adhesion to the substrate. Moreover, the specific resistance thereof was found to be 2.0 μΩ·cm.

EXAMPLE 4

An individual Cu ultrafine particle dispersion having a viscosity of 50 cP as determined at 20° C. was prepared by dispersing Cu ultrafine particles in a mixed solvent of the mineral spirit used in Example 1 and α-terpineol and then a wiring pattern was formed on an Si substrate using the resulting dispersion. In this respect, the Si substrate was provided thereon with an $SiO_2$ film as an insulating film on which a groove having a width of 0.25 μm and a depth of 1 μm (aspect ratio: 4) was formed in the form of a pattern. Moreover a WN barrier film having a thickness of 0.02 μm was formed on the surface of the substrate including the inner walls of the groove through sputtering and a Cu seed film was also formed on the surface of the barrier film through sputtering.

Then the substrate thus treated was mounted on a spin coater, followed by rotating the coater at a rate of 500 rpm and then dropwise addition of the foregoing individual Cu ultrafine particle dispersion from the top of the coater to thus subject the substrate to spin coating. The patterned groove was filled with the dispersion through the spin-coating treatment and accordingly, an even liquid film of the dispersion was formed on the surface of the substrate. The substrate provided thereon with the liquid film was heated to a temperature of 250° C. in a vacuum of not higher than $10^{-2}$ Torr for 2 minutes to evaporate the organic solvent and then fired in an inert gas atmosphere in the presence of $H_2O$ gas ($H_2O$ partial pressure: 10 Torr) for 60 minutes while raising the temperature to 300° C. Moreover, the substrate was fired in an inert gas atmosphere free of any $H_2O$ gas for 30 minutes while raising the temperature up to 400° C. to thus form a Cu-thin film through mutual fusion of Cu ultrafine particles. The Cu-thin film filled up the grooves without forming any void and it was found to be free of any shrinkage and crack. Then the Cu-thin film except for that present within the groove was subjected to the CMP treatment to remove the excess Cu present on the surface of the substrate. Thus, a Cu-thin film having an even surface was formed. The specific resistance of the film thus formed was determined and was found to be 2.0 μΩ·cm.

As has been described above in detail, the individual Cu ultrafine particle dispersion according to the present invention permits the complete embedding or filling of, for instance, fine wiring grooves, via holes and contact holes of LSI substrates with a Cu-thin film and thus permits the formation of a conductive, uniform and fine pattern on a substrate.

What is claimed is:

1. A dispersion containing Cu untrafine particles individually dispersed therein, comprising an organic solvent which is hardly evaporated at room temperature, but can be evaporated during a drying-firing step upon forming a Cu-interconnection on a semiconductor substrate and metal Cu-containing ultrafine particles having a particle size of not greater than 0.01 μm, the surface of the individual Cu ultrafine particles being surrounded by or covered with the organic solvent, these particles being independently dispersed in the solvent, and the dispersion obtained by mixing the organic solvent with the ultrafine particles having a viscosity of not higher than 50 cP at 20° C., and said organic solvent being one member selected from the group consisting of mineral spirits, tridecane, dodecylbenzene and a mixture thereof and these solvents to which one member selected from the group consisting of α-terpineol, a hydrocarbon, an alcohol, an ether, an ester, a ketone, an organic nitrogen atom-containing compound, or an organic silicon atom-containing compound, which have not less than 5 carbon atoms, or a mixture thereof is added.

2. The dispersion containing Cu ultrafine particles individually dispersed therein as set forth in claim 1 wherein the organic solvent is one which can be evaporated at a temperature of not less than 150° C.

3. The dispersion containing Cu ultrafine particles individually dispersed therein as set forth in claim 2 wherein the organic solvent is one member selected from the group consisting of mineral spirits, tridecane, dodecylbenzene and a mixture thereof and these solvents to which one member selected from the group consisting of α-terpineol, a hydrocarbon, an alcohol, an ether, an ester, a ketone, an organic nitrogen atom-containing compound, or an organic silicon atom-containing compound, which have not less than 5 carbon atoms, or a mixture thereof is added.

4. The dispersion containing Cu ultrafine particles individually dispersed therein as set forth in claim 1 wherein the metal Cu-containing ultrafine particles are those comprising Cu ultrafine particles, CuO ultrafine particles or mixed Cu and CuO ultrafine particles.

5. The dispersion containing Cu ultrafine particles individually dispersed therein as set forth in claim 2 wherein the metal Cu-containing ultrafine particles are those comprising Cu ultrafine particles, CuO ultrafine particles or mixed Cu and CuO ultrafine particles.

6. The dispersion containing Cu ultrafine particles individually dispersed therein as set forth in claim 3 wherein the metal Cu-containing ultrafine particles are those comprising Cu ultrafine particles, CuO ultrafine particles or mixed Cu and CuO ultrafine particles.

7. The dispersion containing Cu ultrafine particles individually dispersed therein as set forth in claim 1 wherein the concentration of the metal Cu-containing ultrafine particles in the dispersion ranges from 5 to 70% by weight on the basis of the total weight of the dispersion.

8. The dispersion containing Cu ultrafine particles individually dispersed therein as set forth in claim 2 wherein the concentration of the metal Cu-containing ultrafine particles in the dispersion ranges from 5 to 70% by weight on the basis of the total weight of the dispersion.

9. The dispersion containing Cu ultrafine particles individually dispersed therein as set forth in claim 3 wherein the concentration of the metal Cu-containing ultrafine particles in the dispersion ranges from 5 to 70% by weight on the basis of the total weight of the dispersion.

10. The dispersion containing Cu ultrafine particles individually dispersed therein as set forth in claim 3 wherein the concentration of the metal Cu-containing ultrafine particles in the dispersion ranges from 5 to 70% by weight on the basis of the total weight of the dispersion.

11. The dispersion containing Cu ultrafine particles individually dispersed therein as set forth in claim 1 wherein the metal Cu-containing ultrafine particles include, in addition to metal Cu, at least one metal or metal-containing compound whose solubility in Cu is low and which is susceptible to the reaction with the basic material for a semiconductor substrate.

12. The dispersion containing Cu ultrafine particles individually dispersed therein as set forth in claim 2 wherein the metal Cu-containing ultrafine particles include, in addition to metal Cu, at least one metal or metal-containing compound whose solubility in Cu is low and which is susceptible to the reaction with the basic material for a semiconductor substrate.

13. The dispersion containing Cu ultrafine particles individually dispersed therein as set forth in claim 3 wherein the metal Cu-containing ultrafine particles include, in addition to metal Cu, at least one metal or metal-containing compound whose solubility in Cu is low and which is susceptible to the reaction with the basic material for a semiconductor substrate.

14. The dispersion containing Cu ultrafine particles individually dispersed therein as set forth in claim 3 wherein the metal Cu-containing ultrafine particles include, in addition to metal Cu, at least one metal or metal-containing compound whose solubility in Cu is low and which is susceptible to the reaction with the basic material for a semiconductor substrate.

15. The dispersion containing Cu ultrafine particles individually dispersed therein as set forth in claim 1 wherein the metal Cu-containing ultrafine particles include, in addition to metal Cu, at least one member selected from the group consisting of Mg, Al, B, Ta, Nb and V or at least one member selected from the group consisting of compounds containing these metals.

16. The dispersion containing Cu ultrafine particles individually dispersed therein as set forth in claim 2 wherein the metal Cu-containing ultrafine particles include, in addition to metal Cu, at least one member selected from the group consisting of Mg, Al, B, Ta, Nb and V or at least one member selected from the group consisting of compounds containing these metals.

17. The dispersion containing Cu ultrafine particles individually dispersed therein as set forth in claim 3 wherein the metal Cu-containing ultrafine particles include, in addition to metal Cu, at least one member selected from the group consisting of Mg, Al, B, Ta, Nb and V or at least one member selected from the group consisting of compounds containing these metals.

18. The dispersion containing Cu ultrafine particles individually dispersed therein as set forth in claim 4 wherein the metal Cu-containing ultrafine particles include, in addition to metal Cu, at least one member selected from the group consisting of Mg, Al, B, Ta, Nb and V or at least one member selected from the group consisting of compounds containing these metals.

19. The dispersion containing Cu ultrafine particles individually dispersed therein as set forth in claim 15 wherein an amount of these metals or metal-containing compounds ranges from 0.5 to 5% by weight based on the total weight of the particles.

* * * * *